United States Patent [19]

Sugimoto

[11] Patent Number: 4,600,893
[45] Date of Patent: Jul. 15, 1986

[54] DIFFERENTIAL AMPLIFIER WITH IMPROVED DYNAMIC RANGE

[75] Inventor: Yasuhiro Sugimoto, Yokohama, Japan

[73] Assignee: Kabushiki Kaisha Toshiba, Japan

[21] Appl. No.: 662,097

[22] Filed: Oct. 18, 1984

[30] Foreign Application Priority Data

Oct. 24, 1983 [JP] Japan .................. 58-198689

[51] Int. Cl.[4] .................. H03F 3/45
[52] U.S. Cl. .................. 330/252; 330/257; 330/261
[58] Field of Search .............. 330/252, 257, 261, 288, 330/311, 149, 151

[56] References Cited

U.S. PATENT DOCUMENTS

| | | | |
|---|---|---|---|
| 3,649,926 | 3/1972 | Hill | 330/30 |
| 3,828,268 | 8/1974 | Nishio | 330/30 |
| 4,146,844 | 3/1979 | Quinn | 330/252 X |
| 4,511,852 | 4/1985 | Henrich et al. | 330/252 |

FOREIGN PATENT DOCUMENTS 090543 10/1983 European Pat. Off. .
2520890 12/1975 Fed. Rep. of Germany .
3029316 3/1981 Fed. Rep. of Germany .
3243145 6/1983 Fed. Rep. of Germany .

OTHER PUBLICATIONS

Harris Analog Data Sheet, published by JMC, Aug. 1981.

*Primary Examiner*—Eugene R. LaRoche
*Assistant Examiner*—Steven J. Mottola
*Attorney, Agent, or Firm*—Finnegan, Henderson, Farabow, Garrett & Dunner

[57] ABSTRACT

A differential amplifier has first and second transistors whose bases respectively receive first and second voltage signals. The collectors of the first and second npn transistors are commonly connected to a power source terminal respectively through resistors. The emitters of the first and second npn transistors are grounded through a constant current source. The differential amplifier further has first and second pnp transistors in a common-base configuration. The collectors of the first and second npn transistors are connected to the emitters of the first and second pnp transistors.

11 Claims, 7 Drawing Figures

DIFFERENTIAL AMPLIFIER WITH IMPROVED DYNAMIC RANGE

BACKGROUND OF THE INVENTION

The present invention relates to a differential amplifier and, more particularly, to a high-speed wide-band differential amplifier.

FIG. 1 shows a conventional differential amplifier. This differential amplifier has npn transistors Q1 and Q2 as a differential pair. The bases of the npn transistors Q1 and Q2 are connected to input terminals 10 and 12, respectively. The emitter of the npn transistor Q1 is connected to the emitter of the npn transistor Q2 through resistors R1 and R2. The junction between the resistors R1 and R2 is grounded through a constant current source CS. The collectors of the npn transistors Q1 and Q2 are connected to the emitters of other npn transistors Q3 and Q4, respectively. The bases of the npn transistors Q3 and Q4 are commonly connected to a bias voltage source 16. The collectors of the npn transistors Q3 and Q4 are connected to output terminals 18 and 20, respectively. These collectors are also connected to a power source terminal 22 through resistors R3 and R4, respectively.

The differential amplifier shown in FIG. 1 generates an output signal SO at the output terminals 18 and 20 in accordance with an input signal SI. The input signal SI represents the difference between the voltages applied to the input terminals 10 and 12.

FIG. 2 shows the relationship between the power source voltage and the input and output signals SI and SO with respect to the differential amplifier. (VP1 denotes the maximum voltage of the input signal SI; VI1 denotes a voltage amplitude between the maximum and minimum voltages of the input signal SI; VO1 denotes a voltage amplitude between the maximum and minimum voltages of the output signal SO; VCC denotes the potential at a power source terminal 22; VB denotes the output voltage from the bias voltage source 16; and VBE denotes the voltage between the base and emitter of the transistors Q3 and Q4). As is apparent from FIG. 2, different voltage ranges are assigned to voltage variations of the input signal SI and the output signal SO. The following condition is required in order not to saturate the transistors Q1 and Q2 in the amplification of the input signal SI:

$$VP1 \leq VB - VBE \quad (1)$$

In order to satisfy relation (1), the maximum voltage VP1 of the input signal SI must be limited to a small value. The following condition must be satisfied in order not to saturate the transistors Q3 and Q4 in the amplification of the input signal SI:

$$VO1 \leq VCC - VB \quad (2)$$

In order to satisfy relations (1) and (2), the voltage amplitude VO1 of the output signal SO must be limited to a small value.

In this differential amplifier, the margin for fluctuation of the power source voltage VCC is small. It is therefore very difficult to maintain a predetermined dynamic range. When the power source voltage VCC is set at a low value, the reliability of this differential amplifier becomes low. However, when the voltage amplitude VI1 of the input signal SI is large, the high-frequency amplification characteristics of this differential amplifier are degraded by a Miller effect due to capacitances between collectors and bases of the transistors Q1 and Q2. In this case, the differential amplifier cannot linearly amplify the input signal SI in a wide frequency range.

FIG. 3 shows an improved conventional differential amplifier. This differential amplifier has npn transistors Q1 and Q2 as a differential pair and pnp transistors Q5 and Q6 as another differential pair. The bases of the transistors Q1 and Q5 are commonly connected to a first input terminal 10, and the bases of the transistors Q2 and Q6 are commonly connected to a second input terminal 12. The input signal SI is supplied across the first and second input terminals 10 and 12. The emitter of the transistor Q1 is connected to the emitter of the transistor Q2 through resistors R1 and R2. The junction between the resistors R1 and R2 is grounded through a constant current source CS2. The emitter of the transistor Q5 is connected to the emitter of the transistor Q6 through resistors R5 and R6. The junction between the resistors R5 and R6 is connected to a power source terminal 22 through a constant current source CS1. The collector of the transistor Q1 is connected to the power source terminal 22, and the collector of the transistor Q5 is grounded. The collector of the npn transistor Q2 is connected to the emitter of the pnp transistor Q7. The base of the transistor Q7 is connected to a first bias voltage source 24, and the emitter thereof is connected to the power source terminal 22 through a resistor R7. The collector of the npn transistor Q6 is connected to the emitter of the npn transistor Q8. The base of the transistor Q8 is connected to the second bias voltage source 26. The emitter of the transistor Q8 is grounded through a resistor R8. The collectors of the transistors Q7 and Q8 are commonly connected to the output terminal 18. The resistor R9 is connected across the output terminals 18 and 20. The output terminal 20 is grounded.

In the differential amplifier shown in FIG. 3, when the input signal SI is supplied across the input terminals 10 and 12, the input signal SI is supplied to the differential pair of the transistors Q1 and Q2 and the differential pair of the transistors Q5 and Q6. The transistors Q5 and Q6 generate an output signal having an opposite phase to that of the output signal from the transistors Q1 and Q2. Therefore, the dynamic range of the collector currents of the transistors Q7 and Q8 can be widened. In this case, in order not to generate an offset voltage at the output terminals of the differential amplifier shown in FIG. 3, the amplification characteristics of the differential pairs must be the same. Therefore, matching between the differential pair constituted by the transistors Q1 and Q2 and the differential pair constituted by the transistors Q5 and Q6, and matching between the constant current sources CS1 and CS2 must be established. In addition, matching between the transistors Q7 and Q8 must be established to obtain identical active load characteristics.

However, it is very difficult to do the above matching. In addition to this disadvantage, the differential amplifier shown in FIG. 3 requires a number of circuit elements, resulting in a high manufacturing cost.

SUMMARY OF THE INVENTION

It is an object of the present invention to provide a high-speed wide-band differential amplifier which assures a wide dynamic range at a relatively low power source voltage.

In order to achieve the above object of the present invention, there is provided a differential amplifier comprising: first and second input terminals for receiving first and second voltage signals; a detecting circuit for detecting the voltage difference between the first and second voltage signals, the detecting circuit including first and second transistors whose bases are respectively connected to the first and second input terminals and a constant current source connected to the emitters of the first and second transistors; a current supplying circuit having first and second terminals respectively connected to the collectors of the first and second transistors, and for supplying constant currents from said first and second terminals; and an amplifying circuit including third and fourth transistors whose emitters respectively are connected to the first and second terminals of the current supplying circuit and which have a complementary relationship with the respective first and second transistors, a bias circuit for supplying bias voltages to the bases of the third and fourth transistors, and a load circuit connected between the collectors of the third and fourth transistors and the ground.

According to the differential amplifier of the present invention, a wide dynamic range can be guaranteed at a relatively low power source voltage. This differential amplifier amplifies an input signal at a wide range and at a high speed, thereby providing a wide variety of applications of this differential amplifier.

DETAILED DESCRIPTION OF THE PREFERRED EMBODIMENTS

Figure 4:
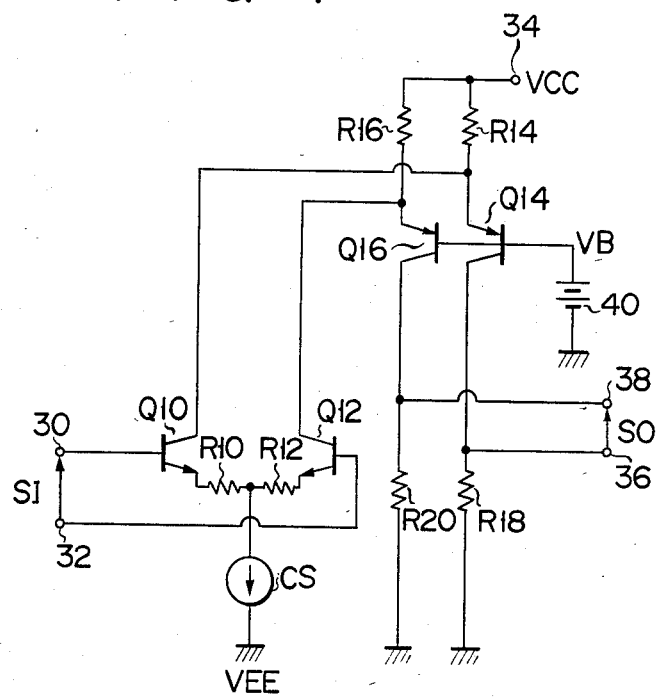
FIG. 4 is a circuit diagram of a differential amplifier according to an embodiment of the present invention.

A differential amplifier according to an embodiment of the present invention will be described with reference to FIGS. 4 and 5. This differential amplifier has npn transistors Q10 and Q12 as a differential pair. The bases of the npn transistors Q10 and Q12 are connected to input terminals 30 and 32, respectively. The emitter of the npn transistor Q10 is connected to the emitter of the npn transistor Q12 through resistors R10 and R12 in series. The junction between the resistors R10 and R12 is connected to a reference potential terminal VEE, e.g., the ground through a constant current source CS. An input signal SI in FIG. 4 corresponds to a voltage difference between a first voltage applied to the input terminal 30 and a second voltage applied to the input terminal 32. The differential amplifier further comprises pnp transistors Q14 and Q16. The pnp transistors Q14 and Q16 are complementary with the npn transistors Q10 and Q12, respectively. The emitter of the pnp transistor Q14 is connected to the collector of the npn transistor Q10 and to a power source terminal 34 through a resistor R14. The emitter of the pnp transistor Q16 is connected to the collector of the npn transistor Q12 and to a power source terminal 34 through a resistor R16. The power source terminal 34 is set at a VCC level potential. The collector of the pnp transistor Q14 is connected to the output terminal 36 and is grounded through a resistor R18. The collector of the pnp transistor Q16 is connected to the output terminal 38 and is grounded through a resistor R20. The difference between voltage drops across the resistors R18 and R20 is supplied as an output signal SO across the output terminals 36 and 38. The bases of the pnp transistors Q14 and Q16 are commonly connected to a bias voltage source 40. In this differential amplifier, the resistors R10, R14 and R18 have the same resistances as the resistors R12, R16 and R20, respectively. The npn and pnp transistors Q10 and Q14 have the same static characteristics as the npn and pnp transistors Q12 and Q16, respectively.

The operation of the differential amplifier having the arrangement described above will now be described. When the first and second voltages having the same value are applied to the bases of the npn transistors Q10 and Q12 through the input terminals 30 and 32, respectively (i.e., input signal SI=0 V), a collector current which is the same as that flowing through the npn transistor Q12 flows through the npn transistor Q10. At the same time, a current which is the same as that flowing through the pnp transistor Q16 flows through the pnp transistor Q14. The currents flowing through the pnp transistors Q14 and Q16 are preset at specific values by previously adjusting the voltage VB of the bias voltage source 40. When the same currents flow from the pnp transistors Q14 and Q16 to the resistors R18 and R20, the potentials at the output terminals 36 and 38 become equal to each other due to voltage drops across the resistors R18 and R20. Voltages of 0 V appear as output signal SO at the output terminals 36 and 38.

When the first voltage is higher than the second voltage (i.e., input signal SI>0 V), a collector current through the transistor Q10 is larger than that through the npn transistor Q12. However, the currents flowing through the load resistors R14 and R16 of the npn transistors Q10 and Q12 will not be changed and are kept constant. Therefore, the collector current through the pnp transistor Q14 changes at a smaller amplitude than that of the collector current flowing through the pnp transistor Q16. In this case, the voltage drop across the resistor R18 is smaller than that across the resistor R20. As a result, a positive voltage appears as the output signal SO across the output terminals 36 and 38.

On the contrary, when the second voltage is higher than the first voltage (i.e., input signal SI<0 V), the collector current through the npn transistor Q12 is larger than that through the npn transistor Q10. A collector current through the pnp transistor Q16 changes at a smaller amplitude than that of the collector current flowing through the pnp transistor Q14. In this case, a voltage drop across the load resistor R18 is smaller than that across the load resistor R20. As a result, a negative voltage appears as the output signal SO across the output terminals 36 and 38.

The differential amplifier generates the output signal SO having the same phase as the input signal SI. In this case, the output signal SO is amplified to have a larger amplitude than that of the input signal SI by means of a first common-base amplifier constituted by the pnp transistor Q14 and the resistor R18 and a second common-base amplifier constituted by the pnp transistor Q16 and the resistor R20.

Figure 5:
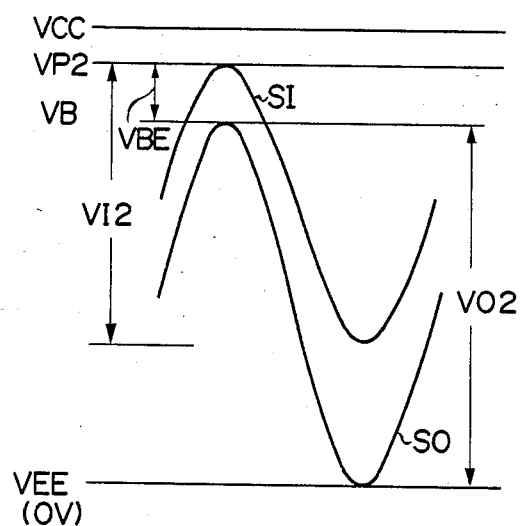
FIG. 5 is a chart explaining the relationship between the power source voltage and the input and output signals with respect to the differential amplifier in FIG. 4.

FIG. 5 is the power source voltage and a chart explaining the relationship between the input and output signals with respect to this differential amplifier. (Referring to FIG. 5, VP2 denotes a maximum voltage of the input signal SI; VI2 denotes a voltage amplitude between the maximum and minimum voltages of the input signal SI; VO2 denotes a voltage amplitude between the maximum and minimum voltages of the output signal SO; VBE denotes the voltage between the base and emitter of the npn transistors Q10 and Q12; and VB denotes the output voltage from the bias voltage source 40.)

The following equation must be satisfied in order not to saturate the npn transistors Q10 and Q12 in the amplification of the input signal SI:

$$VP2 = VB + VBE \qquad (3)$$

Similarly, the following relation must be satisfied in order not to saturate the pnp transistors Q14 and Q16 in the amplification of the input signal SI:

$$V02 < VB \qquad (4)$$

In the differential amplifier of this embodiment, the input signal SI and the output signal SO change between the power source voltage VCC and ground. In this case, a specific voltage range is commonly used for the input and output signals SI and SO. When the value of the power source voltage VCC is predetermined, the bias voltage VB is adjusted to come closer to the power source voltage VCC so as to set the VP2 in equation (3) and VO2 in relation (4) to be larger than VP1 and VO1, thereby widening the dynamic range of the differential amplifier. However, when the dynamic range is predetermined, a fluctuation margin of the power source voltage VCC which is allowed for the predetermined dynamic range can be set to be large in this differential amplifier. For this reason, even if the power source voltage is set at a relatively low value, the operation of the differential amplifier can be guaranteed.

Figure 1:
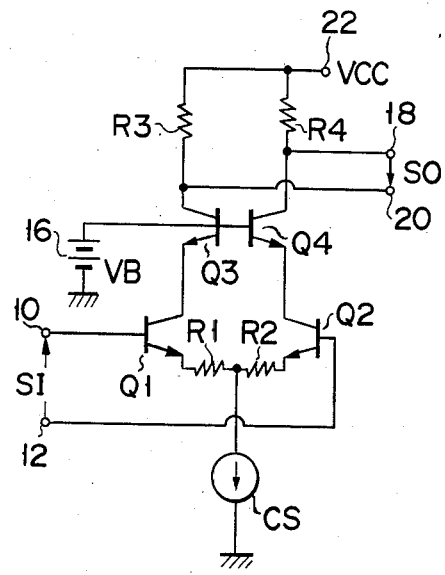
FIG. 1 is a circuit diagram of a conventional differential amplifier.
Figure 2:
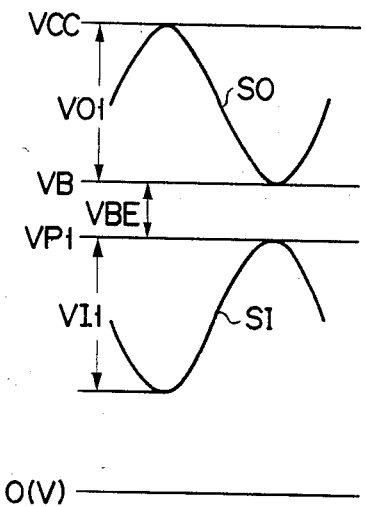
FIG. 2 is a chart explaining the relationship between the power source voltage and the input and output signals with respect to the differential amplifier in FIG. 1.
Figure 3:
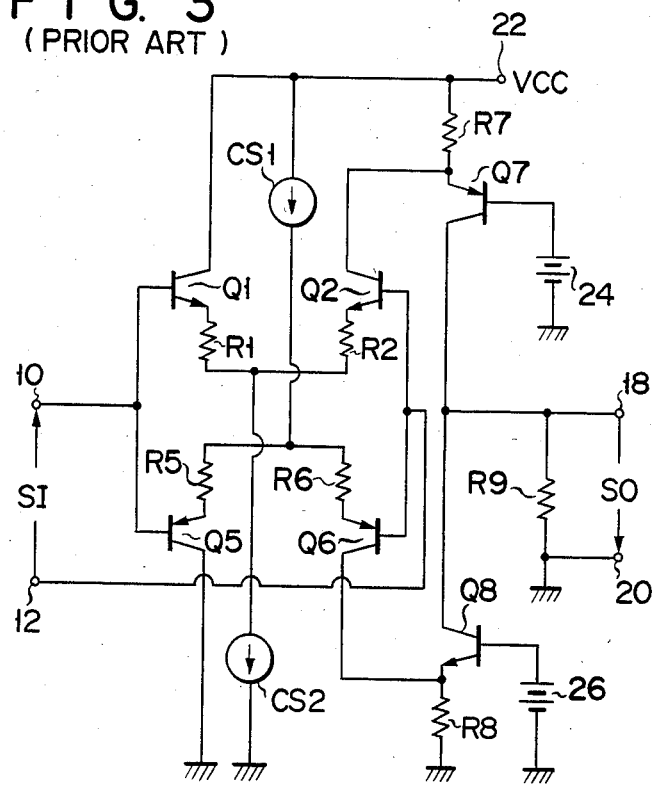
FIG. 3 is a circuit diagram showing an improved model of the conventional differential amplifier as in FIG. 1.

The collectors of the npn transistors Q10 and Q12 are connected to the emitters of the transistors Q14 and Q16 in the common-base configuration, and a current flows from the power source terminal 34 into the emitters of pnp transistors Q14, Q16 through the resistors R14, R16. The constant current source CS is set to supply a constant current lower than a constant current flowing into the resistors R14, R16. The output inpedance of the npn transistors Q10, Q12 is kept low. For this reason, the Miller effect caused by capacitances between the collectors and bases of the npn transistors Q10 and Q12 will not appear even if the input signal SI has a large amplitude. Therefore, this differential amplifier has a wide-range amplification and fast response-time characteristics. In addition, the number of circuit elements in this differential amplifier is smaller than that of the differential amplifier in FIG. 3. Therefore, it is very easy to match the npn transistors Q10 and Q12, and the pnp transistors Q14 and Q16, thereby decreasing the manufacturing cost of the differential amplifier.

Figure 6:
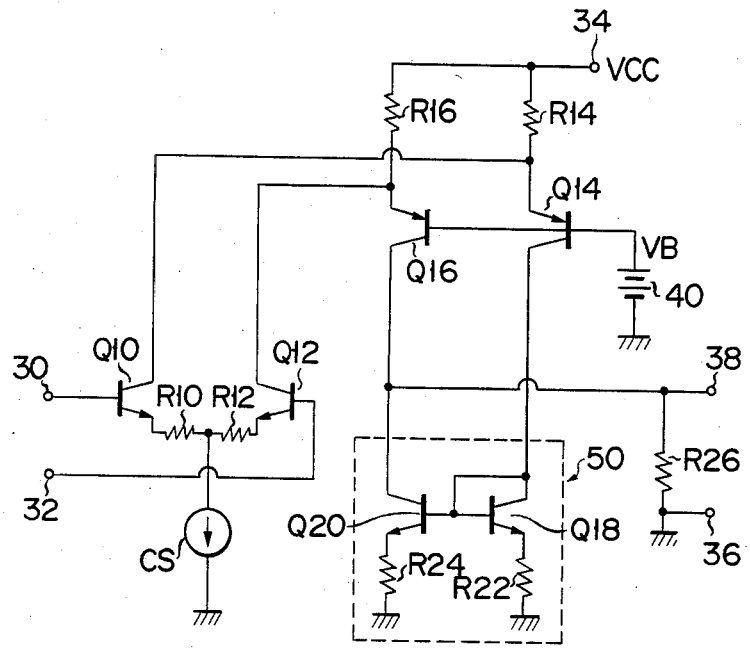
FIG. 6 is a circuit diagram of a differential amplifier similar to that in FIG. 4 according to another embodiment of the present invention.

The present invention is not limited to the particular embodiment described above. For example, the resistors R18 and R20 in FIG. 3 may be replaced with active loads, respectively. FIG. 6 shows a differential amplifier wherein the active loads are constituted by a current mirror circuit. A current mirror circuit 50 comprises npn transistors Q18 and Q20. The base of the npn transistor Q18 is connected to its collector and to the base of the npn transistor Q20. The collectors of the npn transistors Q18 and Q20 are connected to the collectors of the pnp transistors Q14 and Q16, respectively. The emitters of the npn transistors Q18 and Q20 are grounded through resistors R22 and R24, respectively. The output terminals 38 and 36 are connected across a resistor R26. The resistor R26 is connected between the collector of the npn transistor Q20 and ground. The same reference numerals as in FIG. 6 denote the same parts as in FIG. 4. The resistors R14 and R16 as loads of the npn transistors Q10 and Q12 may be replaced with a constant current source, and the resistors in the current mirror circuit 50 may be omitted.

Figure 7:
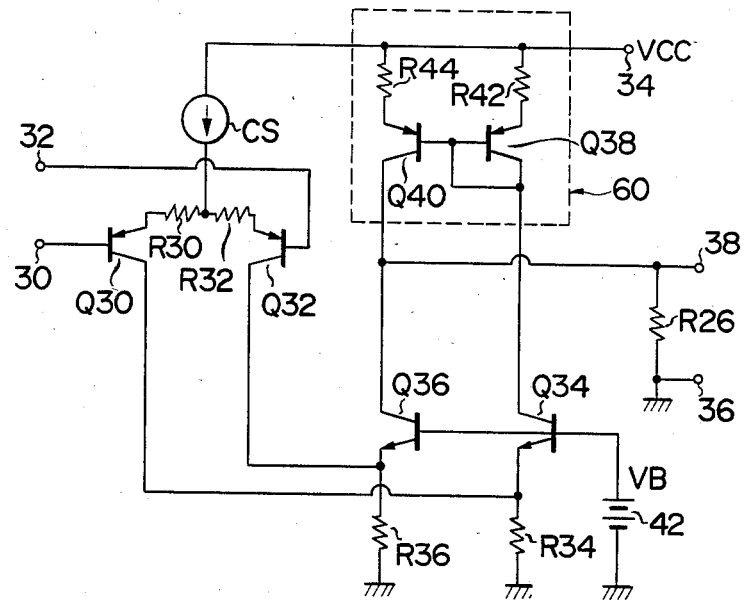
FIG. 7 is a circuit diagram of a differential amplifier similar to that in FIG. 6 according to still another embodiment of the present invention.

The differential amplifier in FIG. 6 may be modified to that in FIG. 7. In the differential amplifier in FIG. 7, the npn transistors Q10, Q12, Q18 and Q20 are replaced with pnp transistors Q30, Q32, Q34 and Q36, respectively. In addition, the pnp transistors Q14 and Q15 in FIG. 6 are replaced with npn transistors Q34 and Q36, respectively. Resistors R30, R32, R34, R36, R42 and R44 in FIG. 7 correspond to the resistors R10, R12, R14, F16, R22 and R24, respectively. A bias voltage source 42 in FIG. 7 corresponds to the bias voltage source 40 in FIG. 6. The same reference numerals as in FIG. 7 denote the same parts as in FIG. 6.

In the above embodiments, emitter resistors R14 and R16 or R34 and R36 of the transistors constituting the differential pair may have a resistance of 0Ω when the input signal voltage does not greatly change.

According to the differential amplifier of the present invention, a wide dynamic range can be guaranteed at a relatively low power source voltage. This differential amplifier amplifies an input signal at a wide range and at a high speed, thereby providing a wide variety of applications of this differential amplifier.

What is claimed is:

1. A differential amplifier comprising:
   first and second potential terminals between which a power source voltage is applied;
   detecting means, including first and second transistors whose emitters are coupled to each other and further including a constant current source connected between said first potential terminal and the junction of the emitters of said first and second transistors, for detecting a voltage difference between first and second voltage signals supplied to the base of said first and second transistors, respectively;
   amplifying means including third and fourth transistors which have a complementary relationship to said first and second transistors, and whose emitters are respectively connected to the collectors of said first and second transistors, said amplifying means also including a bias circuit for supplying bias voltages to the bases to said third and fourth transistors, and a load circuit connected between the collectors of said third and fourth transistors and said first potential terminal;

first connecting means coupling said second potential terminal with the emitter of said third transistor, for setting the potential at the emitter of said third transistor to a level corresponding to that of said second potential terminal; and second connecting means coupling said second potential terminal with the emitter of said fourth transistor, for setting the potential at the emitter of said fourth transistor to a level corresponding to that of said second potential terminal.

2. A differential amplifier according to claim 1, wherein said first and second connecting means include, respectively, first and second voltage drop means.

3. A differential amplifier according to claim 1, wherein said first and second connecting means include, respectively, second and third constant current sources.

4. A differential amplifier according to claim 2, wherein said first and second voltage drop means are each resistors of equal resistance.

5. A differential amplifier according to claim 4, wherein said bias circuit is connected to the bases of said third and fourth transistors.

6. A differential amplifier according to claim 5, wherein said load circuit includes third voltage drop means connected between said first potential terminal and the collector of said third transistor, and fourth voltage drop means connected between the first potential terminal and the collector of said fourth transistor.

7. A differential amplifier according to claim 6, wherein said third and fourth voltage drop means are each resistors of equal resistance.

8. A differential amplifier according to claim 7, wherein said detecting means includes a first resistor connected between said first constant current source and the emitter of said first transistor and a second resistor connected between said first constant current source and the emitter of said second transistor, said resistors in said detecting means having the same resistance.

9. A differential amplifier according to claim 1, wherein said first and second transistors are of a pnp type, and said third and fourth transistors are of an npn type.

10. A differential amplifier according to a claim 1, wherein said first and second transistors are of an npn type, and said third and fourth transistors are of a pnp type.

11. A differential amplifier according to claim 1, wherein said load circuit comprises a current mirror circuit for delivering equal collector currents to said third and fourth transistors.

* * * * *